United States Patent
Ishikawa et al.

(10) Patent No.: US 10,089,420 B2
(45) Date of Patent: Oct. 2, 2018

(54) SIMULATION APPARATUS, CONTROLLING METHOD, PROGRAM AND INFORMATION STORAGE MEDIUM FOR THE SIMULATION APPARATUS

(71) Applicant: Sony Computer Entertainment Inc., Tokyo (JP)

(72) Inventors: Hitoshi Ishikawa, Tokyo (JP); Hiroshi Matsuike, Tokyo (JP); Koichi Yoshida, Tokyo (JP)

(73) Assignee: Sony Interactive Entertainment Inc., Tokyo (JP)

( * ) Notice: Subject to any disclaimer, the term of this patent is extended or adjusted under 35 U.S.C. 154(b) by 967 days.

(21) Appl. No.: 14/564,497

(22) Filed: Dec. 9, 2014

(65) Prior Publication Data
US 2015/0169804 A1    Jun. 18, 2015

(30) Foreign Application Priority Data
Dec. 18, 2013 (JP) ................... 2013-261859

(51) Int. Cl.
*G06F 7/60* (2006.01)
*G06F 17/10* (2006.01)
*G06F 17/50* (2006.01)

(52) U.S. Cl.
CPC ................ *G06F 17/5009* (2013.01)

(58) Field of Classification Search
CPC .................................................. G06F 17/5009
USPC .......................................................... 703/2
See application file for complete search history.

(56) References Cited

U.S. PATENT DOCUMENTS

| | | | |
|---|---|---|---|
| 5,500,650 A | 3/1996 | Snodgrass | |
| 5,734,833 A | 3/1998 | Chiu | |
| 5,920,900 A | 7/1999 | Poole | |
| 6,567,817 B1 | 5/2003 | VanLeer | |
| 7,050,955 B1 | 5/2006 | Carmel | |
| 8,271,587 B2 | 9/2012 | Ishizaki | |
| 8,548,776 B2 * | 10/2013 | Rodyushkin | G06F 17/5009 703/2 |
| 9,020,787 B2 * | 4/2015 | Grinspun | G06F 17/5009 703/2 |
| 2006/0200314 A1 | 9/2006 | Ajioka | |
| 2012/0135803 A1 | 5/2012 | Nonaka | |

OTHER PUBLICATIONS

Office Action for related U.S. Appl. No. 14/564,474, 7 pages, dated Sep. 21, 2017, 7 pages.

* cited by examiner

*Primary Examiner* — Timothy A Mudrick
(74) *Attorney, Agent, or Firm* — Matthew B. Dernier, Esq.

(57) ABSTRACT

A simulation apparatus which simulates a position of each of plural objects, which move in a virtual space together with time, at each of plural time points of calculation. The apparatus includes: an object pair information acquisition unit acquiring plural pieces of information of object pairs each including, as components thereof, two objects which contact with each other at each of the plural time points of calculation; an allocation unit allocating, at each of the plural time points of calculation, each of the plural object pairs to one of plural groups such that two or more object pairs which include a common object do not belong to the same group; and a calculation unit calculating, at each of the plural time points of calculation, an influence of contact of two objects included in each of the plural object pairs upon positions of the two objects.

8 Claims, 10 Drawing Sheets

FIG.10

| TIME COUNTER | t=n | | | | t=n+1 | | |
|---|---|---|---|---|---|---|---|
| STEP | STEP 0 | STEP 1 | STEP 2 | STEP 3 | STEP 3 | STEP 4 | STEP 5 |
| OBJECT | A C B | A C→B | A→C B | A C B | A C→B | A C→B | A→C→B |
| ROUTE VALUE | A C B | A B B | A A B | A A B | A A B | A A B | A A C |
| POINTER VALUE | A C B | A B B | A A B | A C B | A C B | A C C | A A C |

FIG.11A
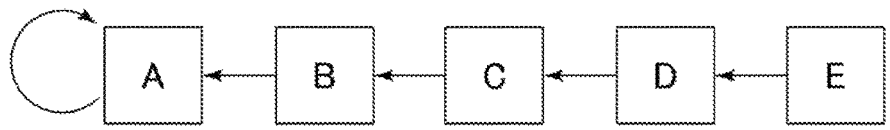
FIG.11B
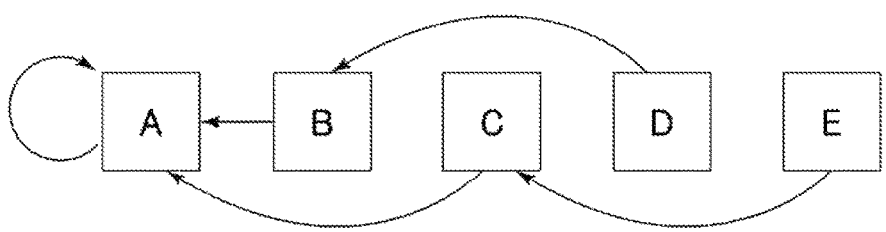
FIG.11C
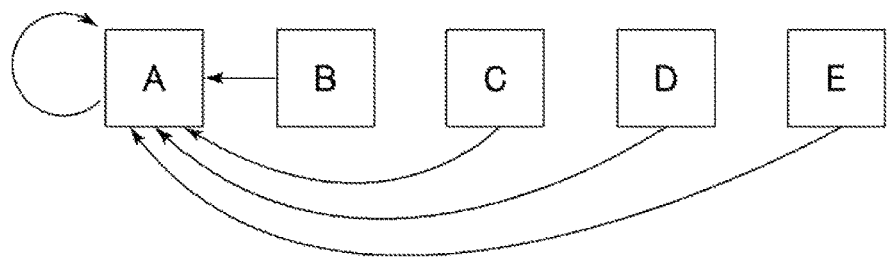
FIG.12
| IDENTIFIER | A | B | C | D | E |
|---|---|---|---|---|---|
| POINTER VALUE (INITIAL VALUE) | A | A | B | C | D |
| POINTER VALUE (UPDATED ONCE) | A | A | A | B | C |
| POINTER VALUE (UPDATED TWICE) | A | A | A | A | A |

SIMULATION APPARATUS, CONTROLLING METHOD, PROGRAM AND INFORMATION STORAGE MEDIUM FOR THE SIMULATION APPARATUS

BACKGROUND

The present technology relates a simulation apparatus which executes a simulation for a plurality of objects which move in a virtual space together with time, controlling method, a program and an information storage medium for a simulation apparatus.

In a simulation in which collision determination of a plurality of objects disposed in a virtual space is carried out, collision determination is done based on the positions of two objects in the virtual space. Here, to do collision determination of a plurality of objects in the round-robin is inefficient in that, as the number of objects increases, the calculation amount increases enormously. Therefore, as one of techniques for reducing the number of times of collision determination, collision determination is often carried out which uses a binary tree which reflects a positional relationship of a plurality of objects in a virtual space. Where a binary tree which reflects a positional relationship of objects is used, collision determination of different objects positioned remotely from each other in the virtual space can be skipped.

As a construction method of such a binary tree as described above, for example, the following method is available. In particular, a region which includes all objects is determined as a root. Then, the region is divided into two divisional regions determined as child nodes, and each of the divisional regions is divided into two divisional regions determined as grandchild nodes. Then, the process of determining such child nodes and grandchild nodes as just described is recursively repeated until each of such divisional regions each of which includes only one object becomes a leaf.

SUMMARY

Here, in order to reduce the processing load involved in increase of the object number in construction of a binary tree, preferably the construction of a binary tree is executed by parallel processing. However, with the binary tree construction method described above, parallel processing cannot sometimes be carried out efficiently because the numbers of objects included in divisional regions of different layers are different from each other.

It is desirable to provide a construction method for a binary tree which is suitable for parallel processing and reflects the position of objects in a virtual space for carrying out collision determination of the objects.

A simulation apparatus according to a mode of the present technology is a simulation apparatus which simulates a position of each of a plurality of objects, which move in a virtual space together with time, at each of a plurality of points of time of calculation. The simulation apparatus includes an object pair information acquisition unit configured to acquire a plurality of pieces of information of object pairs each including, as components thereof, two objects which contact with each other at each of the plural points of time of calculation. The simulation apparatus further includes an allocation unit configured to allocate, at each of the plural points of time of calculation, each of the plural object pairs corresponding to the acquired information to one of a plurality of groups such that two or more object pairs which include a common object do not belong to the same group. The simulation apparatus further includes a calculation unit configured to calculate, at each of the plural points of time of calculation, an influence of contact of two objects included in each of the plural object pairs corresponding to the acquired information upon positions of the two objects. In the simulation apparatus, the calculation unit executes the calculations of the object pairs in parallel to each other while preventing the calculations for the object pairs which belong to groups different from each other from being executed in parallel to each other. When the allocation of an object pair at the present point of time of calculation is carried out, the allocation unit refers to allocation information when the object pairs were allocated to a plurality of groups at the immediately preceding point of time of calculation. Then the allocation unit determines allocation of the object pairs such that object pairs between which the two components are common at the immediately preceding point of time of calculation and at the present point of time of calculation belong to a group same as the group to which the two components were allocated at the immediately preceding point of time of calculation.

Another mode of the present technology is a controlling method for a simulation apparatus which simulates a position of each of a plurality of objects, which move in a virtual space together with time, at each of a plurality of points of time of calculation. The controlling method includes acquiring a plurality of pieces of information of object pairs each including, as components thereof, two objects which contact with each other at each of the plural points of time of calculation. The controlling method further includes allocating, at each of the plural points of time of calculation, each of the plural object pairs corresponding to the acquired information to one of a plurality of groups such that two or more object pairs which include a common object do not belong to the same group. The controlling method further includes calculating, at each of the plural points of time of calculation, an influence of contact of two objects included in each of the plural object pairs corresponding to the acquired information upon positions of the two objects. The calculation is executed in parallel for the object pairs while the calculations for the object pairs which belong to groups different from each other are prevented from being executed in parallel to each other. In the allocation, when the allocation of an object pair at the present point of time of calculation is carried out, allocation information when the object pairs were allocated to a plurality of groups at the immediately preceding point of time of calculation is referred to. Then the allocation determines allocation of the object pairs such that object pairs between which the two components are common at the immediately preceding point of time of calculation and at the present point of time of calculation belong to a group same as the group to which the two components were allocated at the immediately preceding point of time of calculation.

A further mode of the present technology is a program for a simulation apparatus, which simulates a position of each of a plurality of objects, which move in a virtual space together with time, at each of a plurality of points of time of calculation. The program includes acquiring a plurality of pieces of information of object pairs each including, as components thereof, two objects which contact with each other at each of the plural points of time of calculation. The program further includes allocating, at each of the plural points of time of calculation, each of the plural object pairs corresponding to the acquired information to one of a plurality of groups such that two or more object pairs which include a common object do not belong to the same group. The program further includes calculating, at each of the plural points of time of calculation, an influence of contact of two objects included in each of the plural object pairs corresponding to the acquired information upon positions of the two objects. The calculation executes the calculations of the object pairs in parallel to each other while preventing the calculations for the object pairs which belong to groups different from each other from being executed in parallel to each other. The allocation refers, when the allocation of an object pair at the present point of time of calculation is carried out, to allocation information when the object pairs were allocated to a plurality of groups at the immediately preceding point of time of calculation. Then the allocation determines allocation of the object pairs such that object pairs between which the two components are common at the immediately preceding point of time of calculation and at the present point of time of calculation belong to a group same as the group to which the two components were allocated at the immediately preceding point of time of calculation.

A still further mode of the present technology is a computer-readable information storage medium in which a program for a simulation apparatus, which simulates a position of each of a plurality of objects, which move in a virtual space together with time, at each of a plurality of points of time of calculation, is stored. The program includes acquiring a plurality of pieces of information of object pairs each including, as components thereof, two objects which contact with each other at each of the plural points of time of calculation. The program further includes allocating, at each of the plural points of time of calculation, each of the plural object pairs corresponding to the acquired information to one of a plurality of groups such that two or more object pairs which include a common object do not belong to the same group. The program further includes calculating, at each of the plural points of time of calculation, an influence of contact of two objects included in each of the plural object pairs corresponding to the acquired information upon positions of the two objects. The calculation executes the calculations of the object pairs in parallel to each other while preventing the calculations for the object pairs which belong to groups different from each other from being executed in parallel to each other. The allocation refers, when the allocation of an object pair at the present point of time of calculation is carried out, to allocation information when the object pairs were allocated to a plurality of groups at the immediately preceding point of time of calculation. Then the allocation determines allocation of the object pairs such that object pairs between which the two components are common at the immediately preceding point of time of calculation and at the present point of time of calculation belong to a group same as the group to which the two components were allocated at the immediately preceding point of time of calculation.

The above and other features and advantages of the present technology will become apparent from the following description and the appended claims, taken in conjunction with the accompanying drawings in which like parts or elements denoted by like reference symbols.

BRIEF DESCRIPTION OF THE DRAWINGS

FIG. 10 is a view illustrating an object coupling procedure;

FIG. 11A is a view schematically depicting an example of connection objects connected to each other by an object connection block of the simulation apparatus of FIG. 1;

FIG. 11B is a view schematically depicting an example of the connection objects after pointer values of the connection objects depicted in FIG. 11A are updated;

FIG. 11C is a view schematically depicting an example of the connection objects after the pointer values of the connection objects depicted in FIG. 11B are updated; and FIG. 12 is a view illustrating a transition of the pointer value of each object depicted in FIG. 11A.

DETAILED DESCRIPTION OF THE PREFERRED EMBODIMENT

In the following, an embodiment of the present technology is described in detail with reference to the drawings.

Figure 1:
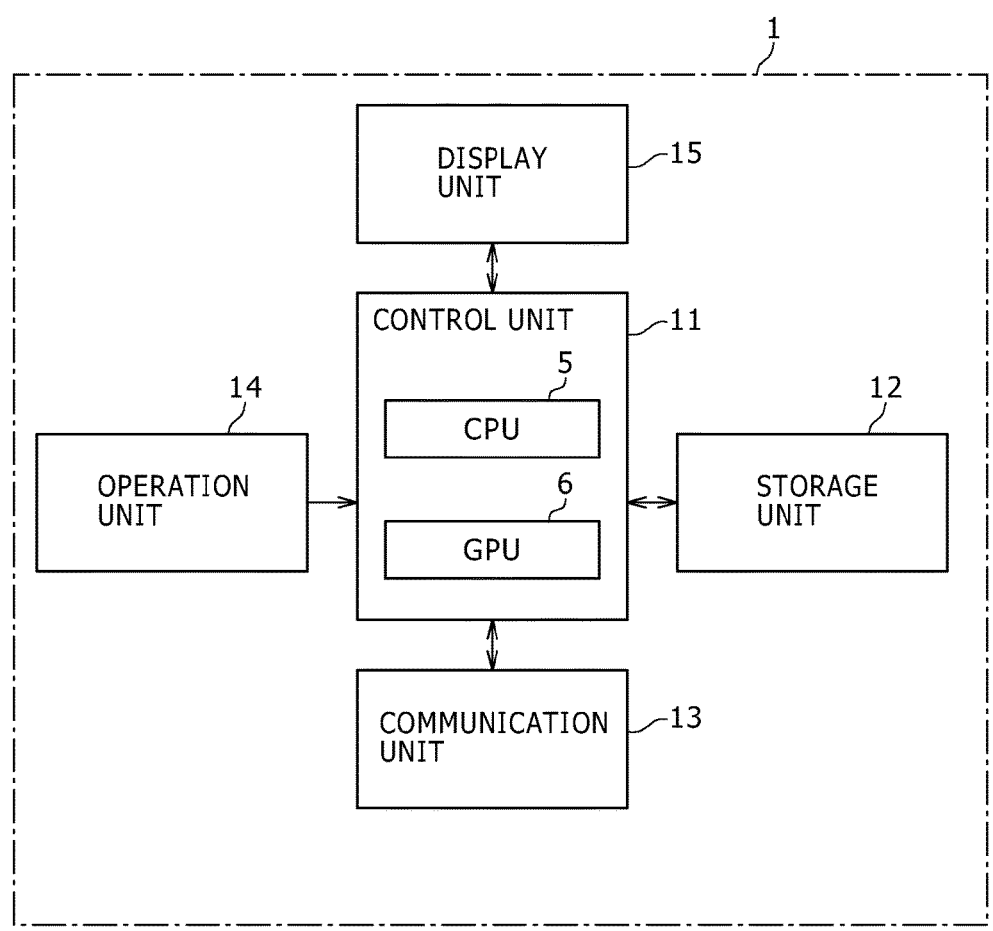
FIG. 1 is a view depicting an example of a configuration of a simulation apparatus according to an embodiment.

FIG. 1 depicts an example of a configuration of a simulation apparatus 1 according to an embodiment of the present technology. Referring to FIG. 1, the simulation apparatus 1 according to the present embodiment is, for example, a game machine for home use or a personal computer. As depicted in FIG. 1, the simulation apparatus 1 includes a control unit 11, a storage unit 12, a communication unit 13, an operation unit 14 and a display unit 15.

The control unit 11 includes a CPU (central processing unit) 5, a GPU (graphics processing unit) 6 and so forth and executes various information processes in accordance with a program stored in the storage unit 12. In the present embodiment, a particular example of processes executed by the control unit 11 is hereinafter described.

The storage unit 12 includes a memory element such as a RAM (random access memory) or a ROM (read only memory), a hard disk drive and so forth and stores a program to be executed by the control unit 11 and various data. The storage unit 12 behaves also as a work memory of the control unit 11.

The communication unit 13 is a communication interface and receives data arriving thereat from the outside through a communication network and outputs the data to the control unit 11. Further, the communication unit 13 transmits various data to a different processing apparatus connected to the communication network in accordance with an instruction from the control unit 11.

The operation unit 14 includes a keyboard, a mouse, a controller for a game machine for home use and so forth. The operation unit 14 accepts an operation input of a user and outputs a signal representative of the substance of the operation input to the control unit 11.

The display unit 15 is a display device such as a liquid crystal display unit and displays various images in accordance with an instruction of the control unit 11.

It is to be noted that the simulation apparatus 1 may include an optical disk drive which reads an optical disk such as a DVD-ROM (digital versatile disk ROM) or a Blu-ray (registered trademark) disk, a USB (Universal Serial Bus) port and so forth.

In the following, a particular example of functions implemented by the simulation apparatus 1 according to the present embodiment is described. In the following embodiment, a plurality of objects move in a virtual space, and the position of any object which varies together with time is calculated by a simulation process such as a physical simulation. In the present embodiment, particularly a simulation process which takes an influence of collision of objects upon the position of the objects is executed. Although this simulation process is executed principally by the GPU 6 of the control unit 11, the CPU 5 or some other apparatus may execute the simulation process.

The GPU 6 has a greater number of cores than the CPU 5 and has a greater number of processing units (threads) which can be executed at the same time and therefore is suitable for parallel processing. Meanwhile, it is demanded that threads which are executed at the same time be processes of the contents same as each other. Therefore, in order to efficiently execute the simulation process using the GPU 6, the process is carried out by an algorithm different from an existing algorithm.

It is to be noted that the progression of time in the virtual space is represented by a value of a time counter t, and the value of the time counter t is incremented by one and the simulation process is executed after every given unit time period d. It is to be noted that each calculation time point at which the position of the objects is to be calculated is represented by the time counter t=0, 1, 2, 3, . . . . Further, with each object, ID (identification) information (identifier) which is set uniquely to the object is associated in order to identify the object. Further, attribute information may be associated with each object. The attribute information may include information representative of a type of each object, information which defines a profile and various kinds of other attribute information corresponding to the type of each object.

Figure 2:
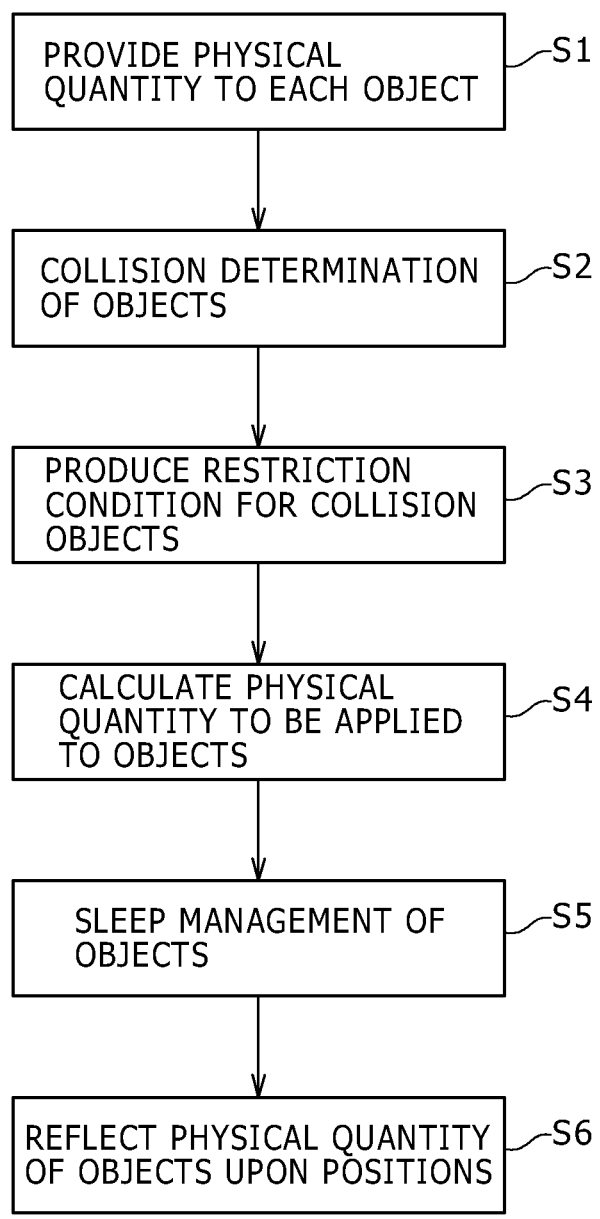
FIG. 2 is a flow chart illustrating a flow of a simulation process executed by the simulation apparatus of FIG. 1.

Here, an example of a flow of the simulation process executed by the simulation apparatus 1 according to the present embodiment is described with reference to a flow chart of FIG. 2. The process illustrated in FIG. 2 is executed every time the value of the time counter t is incremented.

First, a physical quantity (velocity, acceleration or the like) is given to at least some of a plurality of objects disposed in a virtual space (S1). Consequently, the position of the plural objects disposed in the virtual space changes together with time.

Then, at a calculation time point at which the position of the objects is to be calculated, collision of the objects is determined (S2). The process S2 is hereinafter described in detail.

Then, a restriction condition for two objects determined to collide with each other by the process S2 is produced (S3). Here, it is desirable to restrain the movement of the two objects determined as colliding with each other so that, for example, the position of the two objects may not vary any more in the progression directions from the colliding point. If such movement of the objects is not restrained, then such a failure as sinking into each other or passing by each other of the colliding objects occurs. By the process S3, a restriction condition for restraining such movement of the objects is produced. Then, by solving the restriction condition, a physical quantity to be applied to each of the objects for satisfying the restriction condition is calculated (S4). The process S4 is hereinafter described in detail.

At this time, the plural objects which move in the virtual space include some object whose velocity is almost zero. A sleep management for reducing the speed of such an object as is in a substantially stopping state to zero to place the object into a sleep state (to place the object into a stopping state) is carried out (S5). By excluding those objects which are placed in a stopping state as a result of the sleep management from a calculation target, the processing amount for calculation decreases. It is to be noted that, if external force is applied to an object which is placed in a stopping state as a result of the sleep management, then the stopping state of the object by the sleep management is cancelled and the object is added to the calculation target. The process S5 is hereinafter described in detail.

Then, the physical quantity to be applied to each object is reflected on the position of the object in the virtual space (S6). In other words, the position of each object at a timing at which a state of the virtual space is rendered is calculated from the physical quantity to be applied to the object. Then, the simulation apparatus 1 renders an image indicative of a manner of the virtual space in a state in which the objects are disposed at the calculated positions and outputs the image to the display unit 15. Consequently, after the unit time period d elapses, an image of the virtual space in which the objects are disposed at the positions at the point of time at which the positions of the objects are calculated by the simulation apparatus 1 is displayed on the screen of the display unit 15.

Here, the collision determination process of objects by the process S2, the physical quantity calculation process of objects by the process S4 and the sleep management process of objects by the process S5 are described in detail below.

Figure 3:
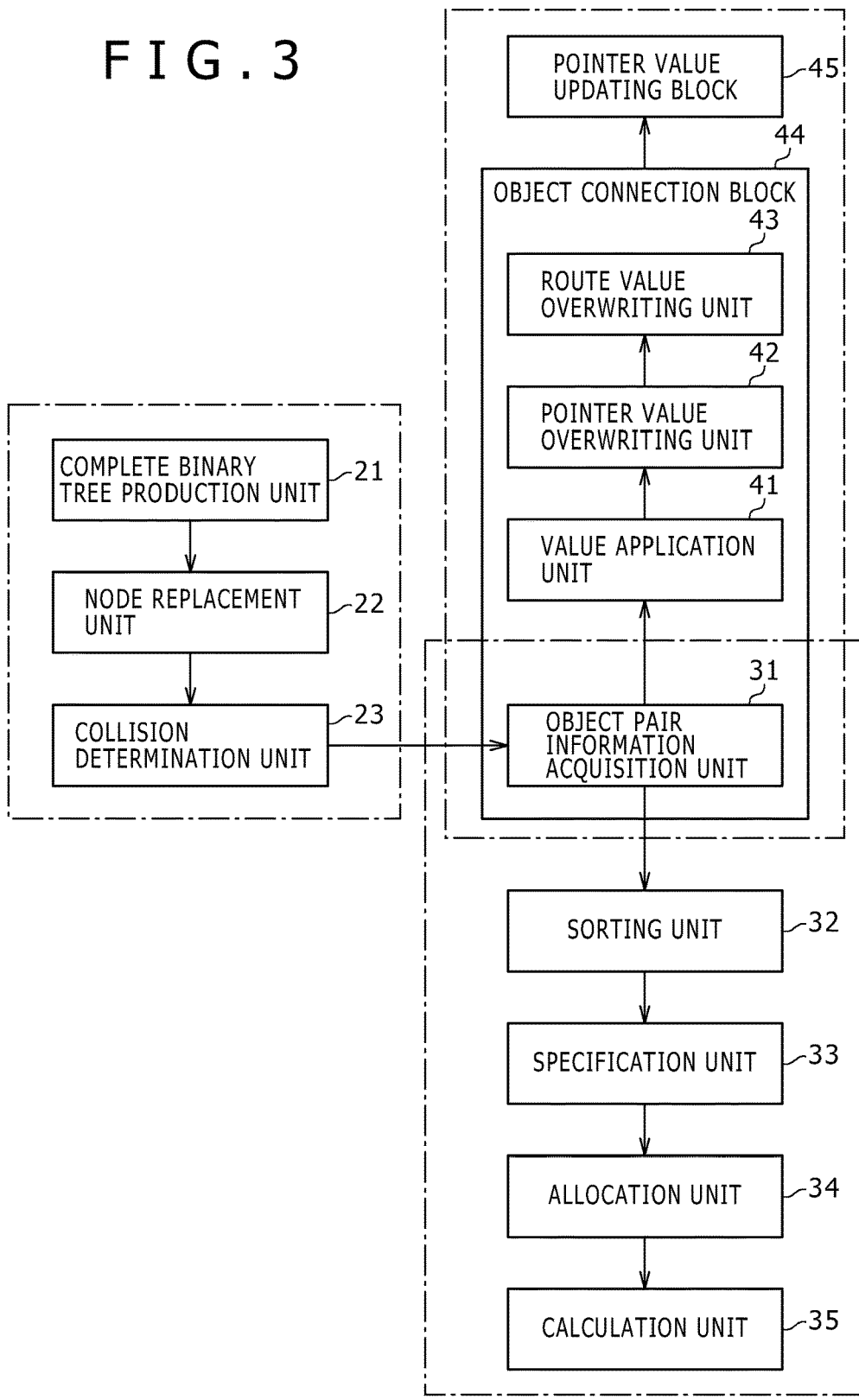
FIG. 3 is a functional block diagram depicting an example of principal functions executed by the simulation apparatus of FIG. 1.

FIG. 3 is a functional block diagram depicting an example of principal functions executed by the simulation apparatus 1 according to the present embodiment. As depicted in FIG. 3, the control unit 11 of the simulation apparatus 1 in the present embodiment functionally includes, for example, a complete binary tree production unit 21, a node replacement unit 22, and a collision determination unit 23. The control unit 11 further includes, for example, an object pair information acquisition unit 31, a sorting unit 32, a specification unit 33, an allocation unit 34, and a calculation unit 35. The control unit 11 further includes, for example, a value application unit 41, a pointer value overwriting unit 42, a route value overwriting unit 43, and a pointer value updating block 45. The functions mentioned are implemented by execution of a program stored in the storage unit 12 by the control unit 11. This program is supplied to the simulation apparatus 1 through a computer-readable information storage medium such as an optical disk, a magnetic disk, a magnetic tape, a magneto-optical disk or a flash memory or through communication means such as the Internet.

First, the object collision determination process by the process S2 is described. The object collision determination process is implemented by the complete binary tree production unit 21, node replacement unit 22 and collision determination unit 23 depicted in FIG. 3.

The complete binary tree production unit 21 produces a complete binary tree wherein position information indicative of the position in a virtual space of each of a plurality of objects disposed in the virtual space is associated with a leaf and the position information which reflects position information of a child node is associated with an internal node.

The position information indicative of the position of an object in the virtual space may be any information which can indicate a positional relationship of objects in the virtual space based on attribute information associated with the objects (for example, information defining a profile) and coordinate information of the virtual space. For example, a boundary volume which connotes an object is used as the position information. This boundary volume indicates the position and the magnitude of a region which inscribes the object in the virtual space in a simplified form. Since the boundary volume is a simplified form of the shape of an object, it can be processed at a higher speed when collision determination is carried out for the boundary volume than when collision determination is carried out for a detailed model of the object. For the boundary volume, for example, a sphere, an axis-aligned bounding box (AABB) which is a parallelepiped having sides parallel to individual axes (x, y and z axes) and so forth are used. Where the boundary volume is a sphere, the center coordinates and the radius of the sphere are used as the position information. Where the boundary volume is an axis-aligned bounding box, the coordinate values of a minimum point at which the coordinate values on the axes are in the minimum and a maximum point at which the coordinate values on the axes are in the maximum are used as the position information. Where the boundary volume is an axis-aligned bounding box, the center coordinates of the axis-aligned bounding box and the distances from the center to three faces which cross perpendicularly with each other may be used as the position information. In short, only it is necessary for the position information to indicate the shape of the boundary volume and the position in the virtual space of an object.

Here, an example wherein an axis-aligned bounding box is used as the position information is described. The complete binary tree production unit 21 associates information (coordinate values of the minimum point, coordinate values of the maximum point and so forth) of the axis-aligned bounding box of each of a plurality of objects disposed in the virtual space as position information with a leaf. At this time, the complete binary tree production unit 21 may associate the position information of the objects with the leaves in the order of the identifiers associated with the objects or may associate the position information of the objects at random with the leaves.

Then, the complete binary tree production unit 21 associates, with a parent node having two leaves as child nodes thereof, information of a new boundary volume which inscribes boundary volumes indicated by two pieces of position information associated with the two child nodes as position information. In particular, information of a new axis-aligned bounding box which connotes axis-aligned bounding boxes indicated by two pieces of position information associated with two leaves which are child nodes of a parent mode is associated as position information of the parent node. The complete binary tree production unit 21 carries out this process for each two leaves to associate the position information with each parent node. Then, the complete binary tree production unit 21 associates, with each parent node having two nodes, with which position information is associated, as child nodes, information of a new axis-aligned bounding box which connotes axis-aligned bounding boxes indicated by two pieces of position information associated with the two nodes as position information. The complete binary tree production unit 21 carries out this process for each two nodes to associate position information with each parent node. In this manner, the complete binary tree production unit 21 produces a complete binary tree wherein position information is associated with all nodes by successively executing a process of associating position information with a parent node for each two nodes up to the root.

Figure 4:
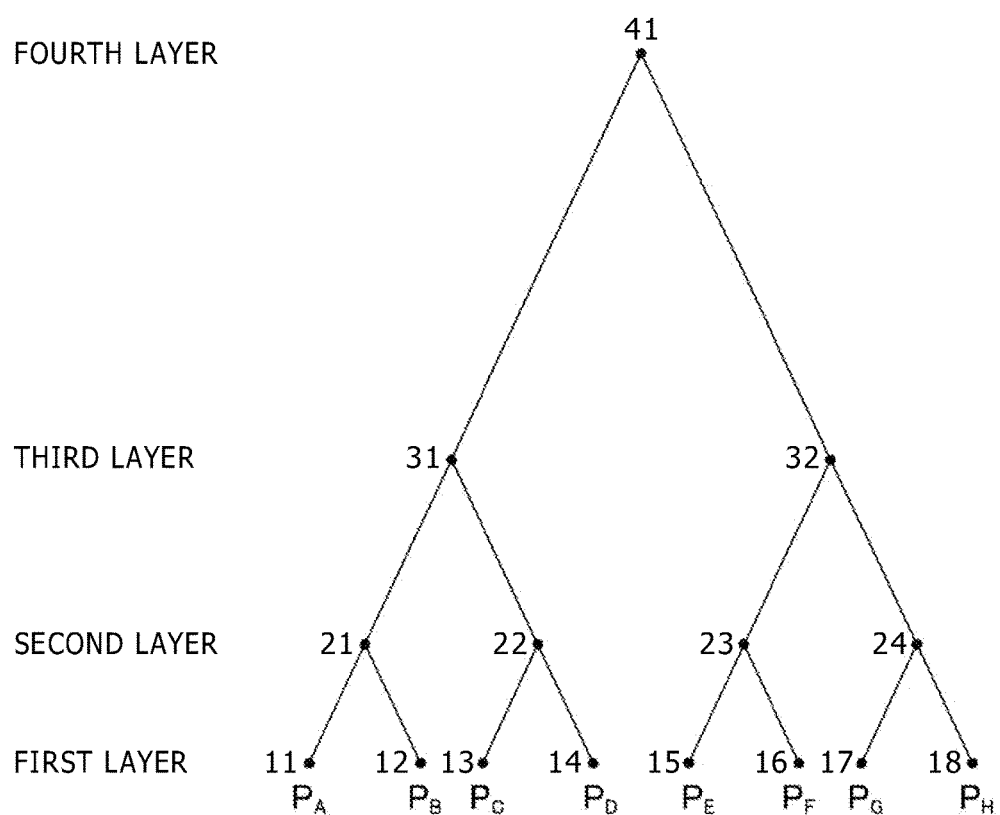
FIG. 4 is a view illustrating an example of a complete binary tree.

A process executed by the complete binary tree production unit 21 is described particularly with reference to a complete binary tree exemplified in FIG. 4. As depicted in FIG. 4, the complete binary tree includes a first layer of leaves, a second layer, a third layer, and a fourth layer which is the root. For the convenience of description, the layers and the positions of the leaves and the nodes are identified such that the leaves of the first layer are identified as leaves 11 to 18 from the left; the nodes of the second layer are identified as nodes 21 to 24 from the left; and the nodes of the third layer are identified as nodes 31 and 32 from the left. Here, it is assumed that, for example, eight objects from an object A to an object H (A to H are identifiers) are disposed in the virtual space. At this time, the axis-aligned bounding boxes which are position information of the objects are represented as $P_A$ to $P_H$. In this case, the complete binary tree production unit 21 associates the position information $P_A$ to $P_H$ of the objects in the order of the identifiers with the leaves 11 to 18 of the first layer, respectively. Then, the complete binary tree production unit 21 associates a new axis-aligned bounding volume, which connotes an axis-aligned bounding volume indicated by the position information $P_A$ associated with the leaf 11 and an axis-aligned bounding volume indicated by the position information $P_B$ associated with the leaf 12, as $P_{AB}$ with the node 21. Similarly, the complete binary tree production unit 21 associates a new axis-aligned bounding volume, which connotes an axis-aligned bounding volume indicated by the position information $P_C$ associated with the leaf 13 and an axis-aligned bounding volume indicated by position information $P_D$ associated with the leaf 14, as $P_{CD}$ with the node 22. Then, the complete binary tree production unit 21 associates a new axis-aligned bounding volume, which connotes the axis-aligned bounding volume indicated by the position information $P_{AB}$ associated with the node 21 and the axis-aligned bounding volume indicated by the position information $P_{CD}$ associated with the node 22, as $P_{ABCD}$ with the node 31. If the complete binary tree production unit 21 successively associates a new axis-aligned bounding volume, which connotes axis-aligned bounding volumes indicated by position information associated with two child nodes, with a parent node in this manner, then $P_{EF}$ is associated with the node 23; $P_{GH}$ is associated with the node 24; and $P_{EFGH}$ is associated with the node 32. It is to be noted that position information associated with the root becomes an axis-aligned bounding volume which connotes all of the objects A to H disposed in the virtual space.

The node replacement unit 22 replaces, for each $2^n$ ($n \geq 1$) nodes, $2 \cdot 2^n$ child nodes, which belong to the $2^n$ nodes, based on the position information associated with the $2 \cdot 2^n$ child nodes beginning with an immediately upper layer from the lowermost layer (leaf layer) of the complete binary tree produced by the complete binary tree production unit 21. Here, the node replacement unit 22 replaces the position information of the objects associated with the leaves of the complete binary tree produced by the complete binary tree production unit 21 into a form of position information which reflects the positional relationship in the virtual space.

The process executed by the node replacement unit 22 is described particularly using the complete binary tree exemplified in FIG. 4. If n=1 is assumed, then the node replacement unit 22 replaces, for each two nodes (node 21 and node 22, node 23 and node 24) in the second layer of the complete binary tree produced by the complete binary tree production unit 21, the child nodes (leaves 11 to 14, leaves 15 to 18) of the two nodes based on four pieces of position information ($P_A$ to $P_D$, $P_E$ to $P_H$) associated with the child nodes. Although a process for the node 21 and the node 22 is described here, also a process for the node 23 and the node 24 is executed simultaneously. First, the node replacement unit 23 selects that one of the axis-aligned boundary boxes indicated by the position information $P_B$, $P_C$ and $P_D$ which has a relatively near positional relationship with the axis-aligned boundary box indicated by the position information $P_A$. For example, the node replacement unit 22 determines the volumes of new axis-aligned boundary boxes (represented as $V_{AB}$, $V_{AC}$ and $V_{AD}$) which individually connote axis-aligned boundary boxes indicated each by two pieces of position information from among the position information $P_A$ and the position information $P_B$, the position information $P_A$ and the position information $P_C$, and the position information $P_A$ and position information $P_D$. Then, it is decided that the smaller the volume, the nearer the positions of two axis-aligned boundary boxes indicated by two pieces of position information. The node replacement unit 22 replaces the position information $P_A$ to $P_D$ so that the combination which minimizes the volume belongs to the node 21. For example, if it is decided that the volume $V_{AC}$ is smallest, then the node replacement unit 22 replaces the position information $P_B$ and the position information $P_C$ with each other such that the position information $P_A$ and the position information $P_C$ belong to the node 21 and the position information $P_B$ and the position information $P_D$ belong to the node 22. Then, a new axis-aligned boundary box which connotes the axis-aligned boundary boxes indicated by the position information $P_A$ and the position information $P_C$ is associated as position information $P_{AC}$ with the node 21. Meanwhile, a new axis-aligned boundary box which connotes the axis-aligned boundary boxes indicated by the position information $P_B$ and the position information $P_D$ is associated as position information $P_{BD}$ with the node 22.

Then, if the replacement of the nodes of the second layer is completed, then the node replacement unit 22 executes a process similar to the process for the second layer described above for child nodes of the two nodes (node 31 and node 32) in the third layer of the complete binary tree wherein the nodes of the second layer have been replaced. Although the complete binary tree exemplified in FIG. 4 includes up to the fourth layer, in a complete binary tree which has a deeper hierarchical layer or layers, such a process as described above is executed for each layer until the uppermost layer (root) is reached. It is to be noted that the process by the node replacement unit 22 may be executed in order beginning with the immediately upper layer than the lowermost layer until the uppermost layer is reached or may be executed for the layers in an arbitrary order.

Another processing method executed by the node replacement unit 22 is described with reference to the complete binary tree exemplified in FIG. 4. For example, where n=1 is assumed, a process for replacing child nodes (leaf 11 to leaf 14) of the node 21 and the node 22 in the second layer of the complete binary tree produced by the complete binary tree production unit 21 based on four pieces of position information ($P_A$ to $P_D$) associated with the child nodes is described. First, as a combination candidate for the position information associated with the node 21 and the node 22, three candidates of $P_{AB}$ and $P_{CD}$, $P_{AC}$ and $P_{BD}$, and $P_{AD}$ and $P_{BC}$ are available. An optimum combination which reflects the positional information in the virtual space is selected from the three different combination candidates. To this end, the node replacement unit 22 determines, for each combination candidate, the sum of volumes of axis-aligned boundary boxes indicated by the position information associated individually with the node 21 and the node 22 (such sums are $V_{AB}+V_{CD}$, $V_{AC}+V_{BD}$, and $V_{AD}+V_{BC}$). Then, the combination which indicates the lowest value from among $V_{AB}+V_{CD}$, $V_{AC}+V_{BD}$, and $V_{AD}+V_{BC}$ is selected as the optimum combination. Then, the node replacement unit 22 replaces the nodes such that the selected optimum combination is obtained. For example, if $V_{AC}+V_{BA}$ exhibits the lowest value, then the node replacement unit 22 replaces the position information $P_B$ and the position information $P_C$ with each other such that the position information $P_A$ and the position information $P_C$ belong to the node 21 and the position information $P_B$ and the position information $P_D$ belong to the node 22.

In the description given above, the node replacement unit 22 carries out replacement of a plurality of child nodes, which are a target of replacement, in the following manner in order to determine a combination of two axis-aligned boundary boxes having a relatively near positional relationship to each other from among axis-aligned boundary boxes individually associated with the child nodes. In particular, the node replacement unit 22 actually calculates the volume of an axis-aligned boundary box which connotes two axis-aligned boundary boxes which make a combination candidate and then replaces the child nodes such that two child nodes associated with two axis-aligned boundary boxes connoted in the axis-aligned boundary box having a smaller volume belong to the same parent node. However, the node replacement unit 22 may not use such a method as just described but may determine a combination of two axis-aligned boundary boxes having a relatively near positional relationship using any applicable method. For example, the node replacement unit 22 may use, as a criterion, the numerical value of the sum total of the lengths of three sides, the length of a diagonal line or the like of an axis-aligned boundary box which connotes two axis-aligned boundary boxes which make a combination candidate to determine a combination of two axis-aligned boundary boxes having a relatively near positional relationship. Also in this case, it can be decided that the lower the numerical value used as the criterion, the smaller the size of the axis-aligned boundary box which connotes two axis-aligned boundary boxes, and it can be determined that the positions of the two axis-aligned boundary boxes is relatively near to each other.

Figure 5:
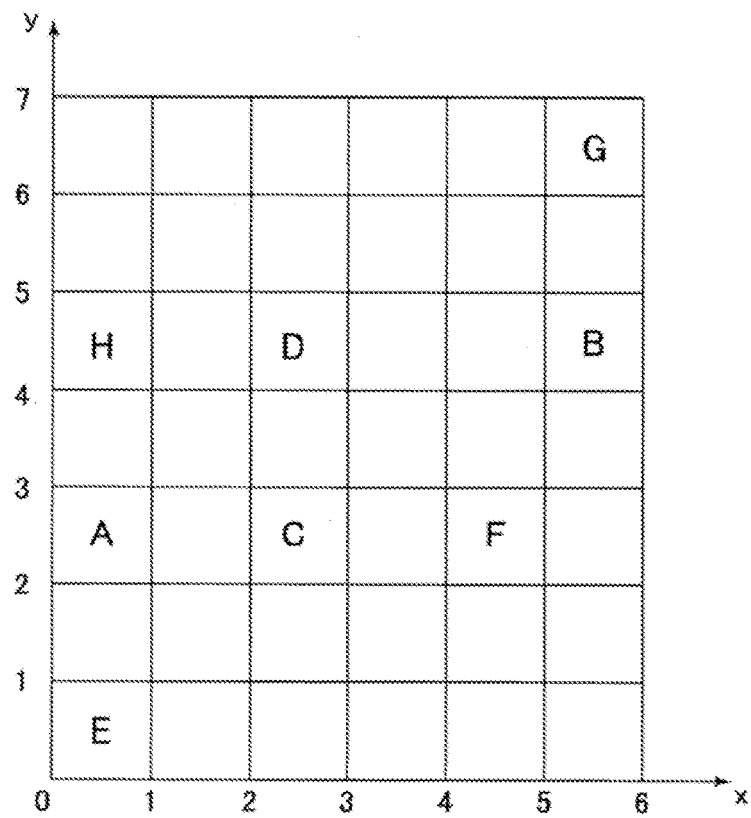
FIG. 5 is a view depicting a simple model of a plurality of objects disposed in a virtual space.

An example in which the processes by the complete binary tree production unit 21 and the node replacement unit 22 described above are carried out using a simple model is described. FIG. 5 depicts a simple model of a plurality of objects disposed in a virtual space. In the simple model depicted in FIG. 5, objects (one lattice represents an object) of an equal size are disposed in a grid-like two-dimensional space (x-y coordinates). In FIG. 5, eight objects from the object A to the object H (A to H are identifiers) are disposed in the virtual space. Also each axis-aligned boundary box representing position information is represented by a lattice. For example, the position information $P_A$ of the object A is an axis-aligned boundary box represented by coordinate values (0, 2) of a minimum point at which the coordinate values on the axes are in the minimum and coordinate values (1, 3) of a maximum point at which the coordinate values on the axes are in the maximum. It is intended to produce a complete binary tree which reflects the positional relationship of the objects A to H in the two-dimensional space.

Figure 6A:
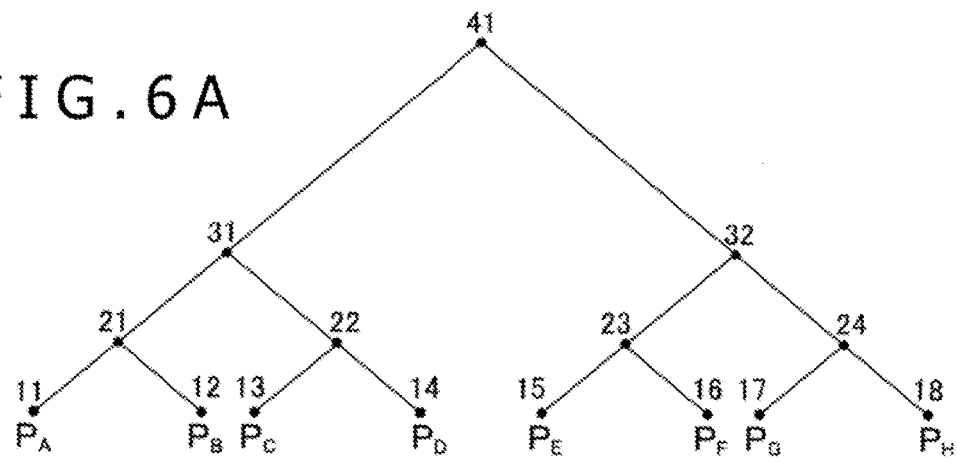
FIG. 6A is a view illustrating an example of a complete binary tree produced by a complete binary tree production unit of the simulation apparatus of FIG. 1.

First, the complete binary tree production unit 21 associates the position information $P_A$ to $P_H$ of the objects A to H in the order of the identifiers with the leaves 11 to 18, respectively, to produce a complete binary tree depicted in FIG. 6A. Then, the node replacement unit 22 determines, for the node 21 and the node 22 of the second layer, the volume (which corresponds, in the simple model, to an area) of a new axis-aligned boundary box which connotes an axis-aligned boundary box indicated by two pieces of position information, namely the position information $P_A$ and the position information $P_B$, the position information $P_A$ and the position information $P_C$, and the position information $P_A$ and the position information $P_D$. Here, if the minimum point coordinates are (xs, ys) and the maximum point coordinates are (xl, yl), then the volume V is given by V=(xl−xs)(yl−ys). First, a new axis-aligned boundary box $P_{AB}$ which connotes axis-aligned boundary boxes indicated by the position information $P_A$ (minimum point (0, 2), maximum point (0, 3)) and the position information $P_B$ (minimum point (5, 4), maximum point (6, 5)) is represented by the minimum point (0, 2) and the maximum point (6, 5). Then, the area of the position information $P_{AB}$ is given by $V_{AB}$=18. Similarly, a new axis-aligned boundary box $P_{AC}$ which connotes axis-aligned boundary boxes indicated by the position information $P_A$ (minimum point (0, 2), maximum point (0, 3)) and the position information $P_C$ (minimum point (2, 2), maximum point (3, 3)) is represented by the minimum point (0, 2) and the maximum point (3, 3). Further, the area $V_{AC}$ is given by $V_{AC}$=3. A new position information $P_{AD}$ which connotes axis-aligned boundary boxes indicated by the position information $P_A$ (minimum point (0, 2), maximum point (0, 3)) and the position information $P_D$ (minimum point (2, 4), maximum point (3, 5)) is represented by the minimum point (0, 2) and the maximum point (3, 5). The area $V_{AD}$ is given by $V_{AD}$=9. From the foregoing, the areas of the new axis-aligned boundary boxes are $V_{AB}$=18, $V_{AC}$=3, and $V_{AD}$=9, and $V_{AC}$ is smallest. Therefore, the position information $P_B$ and the position information $P_C$ are replaced with each other such that the position information $P_A$ and the position information $P_C$ belong to the node 21. Also for the node 23 and the node 24 of the second layer, if the areas $V_{EF}$, $V_{EG}$ and $V_{EH}$ of new axis-aligned boundary boxes which connote axis-aligned boundary boxes indicated by each two pieces of position information, namely, the position information $P_E$ and the position information $P_F$, the position information $P_E$ and the position information $P_G$, and the position information $P_E$ and the position information $P_H$, are determined, then $V_{EF}$=15, $V_{EG}$=42 and $V_{EH}$=5 are obtained. Accordingly, since $V_{EH}$ is lowest, the node replacement unit 22 replaces the position information $P_F$ and the position information $P_H$ with each other such that the position information $P_E$ and the position information $P_H$ belong to the node 23. From the foregoing, the complete binary tree after the node replacement process for the second layer is completed becomes such as depicted in FIG. 6B.

Figure 6B:
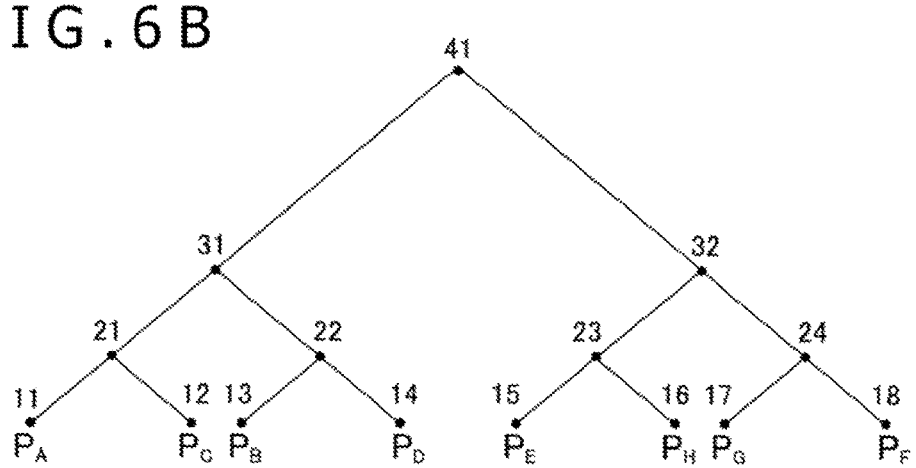
FIG. 6B is a view illustrating an example of the complete binary tree after a node replacement process for a second layer is completed.
Figure 6C:
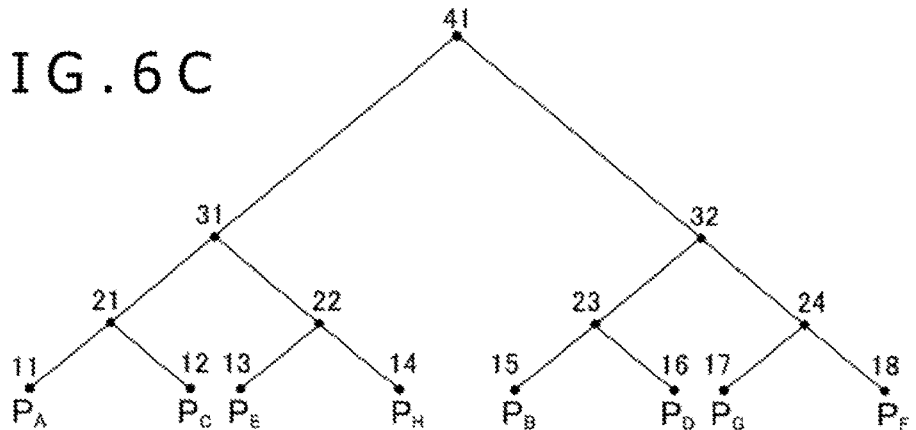
FIG. 6C is a view illustrating an example of the complete binary tree after a node replacement process for a third layer is completed.

Then, the node replacement unit 22 executes a node replacement process for the third layer using the complete binary tree of FIG. 6B. If the areas of new axis-aligned boundary boxes which connote the axis-aligned boundary boxes of each two pieces of the position information, namely, the position information $P_{AC}$ and the position information $P_{BD}$, the position information $P_{AC}$ and the position information $P_{EH}$, and the position information $P_{AC}$ and the position information $P_{GF}$, are determined, then $V_{ACBD}$=18, $V_{ACEH}$=15, and $V_{ACGF}$=30 are obtained. Accordingly, since $V_{ACEH}$ is smallest, the node replacement unit 22 replaces the position information $P_{BD}$ and position information $P_{EH}$ with each other such that the position information $P_{AC}$ and the position information $P_{EH}$ belong to the node 31 and then ends the processing thereby. From the foregoing, the complete binary tree after the node replacement process for the second layer becomes such as depicted in FIG. 6C. Consequently, the complete binary tree on which the positional relationship of the objects in the virtual space depicted in FIG. 6C is reflected is obtained.

Further, the complete binary tree produced by the complete binary tree production unit 21 and the node replacement unit 22 at the time counter t=n may be used to execute a process by the node replacement unit 22 at the time counter t=n+1. In particular, for example, it is assumed that the complete binary tree depicted in FIG. 6C is produced at the time counter t=n. Then, when the complete binary tree production unit 21 is to produce a complete binary tree at the time counter t=n+1, the position information of the objects disposed in the virtual space at the time counter t=n+1 is associated in the same order with the leaves of the complete binary tree depicted in FIG. 6C. In particular, the complete binary tree production unit 21 associates the position information $P_A$, $P_C$, $P_E$, $P_H$, $P_B$, $P_D$, $P_G$, $P_F$ individually with the leaves in order from the left. It is to be noted that the complete binary tree at the time counter t=n+1 is same in the order of the position information of the complete binary tree at the time counter t=n in FIG. 6C, and upon the substance of the position information, the position information in the virtual space at the time counter t=n+1 is reflected. This gradually optimizes the complete binary tree as the time counter is incremented by taking over, at the time counter t=n+1, the corresponding relationships between the objects and the leaves at the time counter t=n because the positions of the objects are less likely to indicate a dramatic change between the time counter t=n and the time counter t=n+1.

It is to be noted that, since all nodes in a complete binary tree have two child nodes without fail, whichever $2^n$ nodes are selected, the number of child nodes of them is equal. Therefore, the node replacement process carried out by the node replacement unit 22 based on position information associated with child nodes of $2^n$ nodes can be executed by a similar algorithm whichever $2^n$ nodes are selected. Accordingly, the node replacement unit 22 can execute the node replacement process in parallel for $2^n$ nodes in each layer.

The complete binary tree completed by the node replacement process by the node replacement unit 22 described above does not sometimes becomes an optimum complete binary tree which reflects the positional relationship of the objects in the virtual space. This arises from the fact that, where the node replacement unit 22 divides the objects in the virtual space into combinations of two objects, when an optimization process of determining a combination which minimizes the positional relationship of two objects is carried out, it falls into a local solution. Therefore, a process executed by the node replacement unit 22 for reducing the possibility that the optimization process may fall into a local solution is described. As described hereinabove, the node replacement unit 22 determines a combination of two pieces of positional information of a relatively near positional relationship from pieces of positional information associated with a plurality of child nodes which make a replacement target. Here, the node replacement unit 22 determines, for each of combination candidates, a numerical value which quantitatively indicates a positional relationship of two child nodes of the combination candidate, and varies the numerical value at random in an increasing direction or a decreasing direction (namely, adds noise to the numerical value). Then, the combination candidate whose numerical value after the variation indicates some decrease is adopted, and the node replacement process is executed so that the adopted combination candidate is established. As a particular example, the node replacement unit 22 uses, as the value which quantitatively indicates a positional relationship of two child nodes, magnitudes (for example, volumes of axis-aligned boundary boxes or the like) of regions which connote regions indicated individually by two pieces of positional information associated with two child nodes. By evaluating a value quantitatively indicating a positional relationship of two child nodes for each combination candidate with random noise added thereto in this manner, it is possible to determine a global optimum solution. In the following, a particular process by the node replacement unit 22 for reducing the possibility that the optimization process may fall into a local solution is described with reference to FIG. 4.

First, a process for replacing child nodes (leaves 11 to 14) of the node 21 and the node 22 of the second layer of the complete binary tree depicted in FIG. 4 with each other based on four pieces of position information ($P_A$ to $P_D$) associated with the child nodes is described. First, as a candidate for a combination of position information associated with the node 21 and the node 22, three candidates of $P_{AB}$ and $P_{CD}$, $P_{AC}$ and $P_{BD}$, and $P_{AD}$ and $P_{BC}$ are available. An optimum combination which reflects the positional information in the virtual space is selected from these three combinations. The node replacement unit 22 selects a combination which minimizes the sum of the volumes of the axis-aligned boundary boxes indicated by the position information associated with the node 21 and the node 22. Here, when the node replacement unit 22 determines the sum of the volumes of the axis-aligned boundary boxes indicated by the position information associated with the node 21 and the node 22, noise is applied to the volumes ($V_{AB}$, $V_{CD}$, $V_{AC}$, $V_{BD}$, $V_{AD}$, $V_{BC}$) of the axis-aligned boundary boxes indicated by the position information associated with the nodes. In particular, the sum of the volumes of the axis-aligned boundary boxes indicated by the position information associated with the node 21 and the node 22 is determined as $(1+\alpha_1)V_{AB}+(1+\alpha_2)V_{CD}$, $(1+\alpha_3)V_{AC}+(1+\alpha_4)V_{BD}$, $(1+\alpha_5)V_{AD}+(1+\alpha_6)V_{BC}$. Here, it is assumed that $\alpha_m$ (m=1 to 6) is given at random within the range of $0<\alpha_m<1$. Alternatively, three different values may be determined for $\alpha_m$ in advance and allocated at random to the combination candidates. The node replacement unit 22 selects, from among combination candidates, the combination candidate which minimizes the sum of the volumes of the axis-aligned boundary boxes indicated by two pieces of position information to which the noise is added to replace the nodes. By executing such a process as just described when the node replacement unit 22 is to replace, for each two nodes, child nodes of the two nodes, the node replacement unit 22 completes an optimum complete binary tree which reduces the possibility of falling into a local solution and finally reflects the positional relationship of the objects in the virtual space.

It is to be noted that the node replacement unit 22 uses, as a value quantitatively indicating a positional relationship of two child nodes of each combination candidate, a magnitude of a region which inscribes two regions indicated by two pieces of position information, more particularly, a volume of an axis-aligned boundary box which connotes axis-aligned boundary boxes indicated by two pieces of position information. However, the value is not limited to the magnitude of a region, namely, the volume of an axis-aligned boundary box. For example, the node replacement unit 22 may use, as a value quantitatively indicative of a positional relationship of two pieces of position information, a value of the sum total of the lengths of three sides, a length of a diagonal line or the like of axis-aligned boundary boxes indicated by two pieces of position information which make a combination candidate. In this case, the node replacement unit 22 randomly varies the numerical value used as the value quantitatively indicative of a positional relationship of two child nodes and executes the node replacement process based on such varied numerical values.

The collision determination unit 23 executes a simulation process for carrying out collision determination of objects using the complete binary tree for which the replacement by the node replacement unit 22 is completed. The collision determination is carried out based on position information associated with child nodes of each node of the complete binary tree. As a collision determination method, for example, where it is based on position information where a boundary volume of a sphere is used, a method is available wherein, when the distance between the center coordinates is smaller than the sum of the radii of the two spheres, it is determined that the spherical boundary volumes are in collision with each other. On the other hand, where the collision determination method is based on position information where an axis-aligned boundary box is used, it is determined based on the coordinate values of a minimum point and the coordinate values of a maximum point whether the axis-aligned boundary boxes indicate some overlap on each axis. Then, when it is determined that such overlap exists on all of the three axes, it is determined that the axis-aligned boundary boxes are in a collision state. Alternatively, where the center coordinates of an axis-aligned boundary box and the distances from the center to three faces orthogonal to each other are used as position information, it may be determined whether or not the distance between the center coordinates on each axis is smaller than the sum of two radii (distances from the centers to the faces). Then, when it is determined that the distances on all of the axes are smaller than the sums, it may be determined that the axis-aligned boundary boxes are in a collision state.

The collision determination by the collision determination unit 23 in the present embodiment is executed using the complete binary tree whose nodes have been replaced by the node replacement unit 22. The collision determination unit 23 carries out, for two nodes, collision determination based on position information associated with the two nodes in each layer in order from the root to the leaves of the complete binary tree. Then, if it is determined that the axis-aligned boundary boxes indicated by the position information associated with the two nodes are in a collision state, then the collision determination unit 23 carries out a collision determination for all combinations of four child nodes of the two nodes. Then, if it is determined that the two nodes are not in a collision state, then the collision determination unit 23 carries out collision determination for each of the child nodes of the two nodes. This is a process executed on the bases of the idea that, if it is determined that two nodes are in a collision state, then there is the possibility that also the child nodes of the two nodes may be in collision with each other, but if it is determined that the two nodes are not in a collision state, then it can be determined that the child nodes of the two nodes are not in a collision state. Since position information associated with a node includes position information of all lower nodes belonging to the node, if it is determined that position information associated with an upper node indicates no collision, then it can be determined that position information associated with the lower nodes indicate not collision. Consequently, the collision determination unit 23 can skip the collision determination of objects which do not collide with each other.

Here, a particular process executed by the collision determination unit 23 is described using the simple model depicted in FIG. 5. The collision determination unit 23 successively carries out collision determination in order in layers from the third layer to the first layer of the complete binary tree depicted in FIG. 6, for which the replacement by the node replacement unit 22 is completed. Further, the collision determination unit 23 carries out, for the nodes of the third layer (node 31 and node 32), collision determination of objects using the collision determination method described hereinabove based on the position information $P_{ACEH}$ associated with the node 31 and the position information $P_{BDGF}$ associated with the node 32. Here, if it is determined whether or not an overlap on the axes is found between the axis-aligned boundary box (minimum point (0, 0), maximum point (3, 5)) indicated by the position information $P_{ACEH}$ and the axis-aligned boundary box (minimum point (2, 2) maximum point (6, 7)) indicated by the position information $P_{BDGF}$, then it is determined that an overlap is found out within a range from the minimum point (2, 2) and the maximum point (3, 5) and the axis-aligned boundary box indicated by the position information $P_{ACEH}$ and the axis-aligned boundary box indicated by the position information $P_{BDGF}$ are in a collision state. Then, since it has been determined that the node 31 and the node 32 are in a collision state, the collision determination unit 23 carries out, upon collision determination in the second layer, collision determination also for all combinations of the child nodes of the node 31 and the node 32. In particular, the collision determination unit 23 carries out collision determination between the node 21 and the node 22, between the node 21 and the node 23, between the node 21 and the node 24, between the node 22 and the node 23, between the node 22 and the node 24, and between the node 23 and the node 24. If the collision determination method described above is used for the determination, then it is determined that the node 21 and the node 22 are in collision with each other and the node 23 and the node 24 in collision with each other. Then, the collision determination unit 23 carries out, upon collision determination in the first layer, collision determination also for all combinations of the child nodes of the nodes. Thus, as a result of the collision determination in the first layer, two objects which collide with each other are specified.

Since the collision determination process in each layer by the collision determination unit 23 involves determination of collision based on position information associated with two nodes as described hereinabove, whichever node is selected, a process of the same algorithm that determination of collision is carried out based on position information associated with the node is carried out. Therefore, combinations of two nodes determination of collision of which is carried out in each layer can be processed in parallel to each other.

Now, a physical quantity calculation process of an object by the process S4 is described. The object physical quantity calculation process is implemented by the object pair information acquisition unit 31, sorting unit 32, specification unit 33, allocation unit 34 and calculation unit 35 depicted in FIG. 3.

Here, a restriction condition for two objects which contact with each other is solved to calculate physical quantities to be provided to the objects in order to satisfy the restriction condition. However, as a pair of objects contacting with each other, for example, an object pair 1 (object A, object B) and another object pair 2 (object A, object C) sometimes exist at the same time. In this case, since the two object pairs commonly include the object A, the calculations regarding the object pairs rely upon each other and it is difficult to process the calculations in parallel. Therefore, a plurality of object pairs which contact with each other are grouped into a plurality of stages for which processing is executed at timings different from each other. It is to be noted that each of the stages has a plurality of threads which can be processed in parallel to each other and object pairs can individually be processed in parallel by allocating the object pairs to the different threads. Then, at a timing at which each stage is to be processed, calculations regarding the object pair allocated to the stage are executed in parallel to each other. Details are described below.

The object pair information acquisition unit 31 acquires information of object pairs each including two objects contacting with each other as components in order. The object pair information acquisition unit 31 acquires two objects, which have been determined to be in collision with each other by the collision determination unit 23, as two objects which contact with each other. In the following description, an object pair including two objects which contact with each other and whose information is acquired by the object pair information acquisition unit 31 is referred to as acquisition object pair. The information of an object pair may be an identifier or attribute information of each object.

The allocation unit 34 allocates each of a plurality of acquisition object pairs acquired by the object pair information acquisition unit 31 to one of a plurality of stages such that two or more acquisition object pairs which include an object common therebetween may not belong to the same stage.

Figures 7, 8:
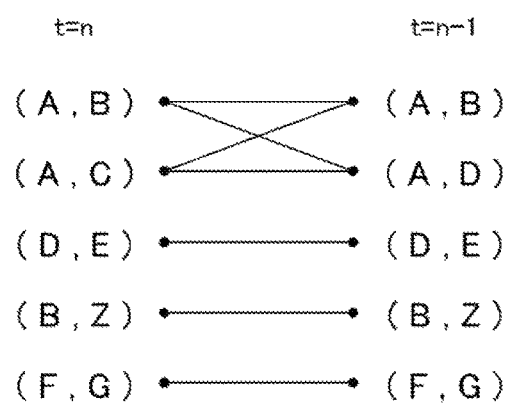
FIG. 7 is a view illustrating an example of acquisition object pairs and an object check table which manages allocation of the acquisition object pairs.
FIG. 8 is a view illustrating an example of determination target pairs and comparison target pairs.

A process executed by the allocation unit 34 is described particularly with reference to FIG. 7. FIG. 7 is a view illustrating an example of acquisition object pairs and an object check table for managing allocation of the acquisition object pairs. The object check table is retained in the storage unit 12. The object check table exemplified in FIG. 7 associates, for each stage, an identifier for identifying each object and a flag indicating that the object identified with the identifier is executed by a calculation process with each other. In particular, if the flag is 1 in a stage s (s≥0), then this indicates that the object identified with the identifier is executed by a calculation process in the stage s, but if the flag is 0, then this indicates that no calculation process is executed in the stage s. In the object check table, all flags are 0 in an initial state.

First, it is assumed that such a plurality of acquisition object pairs as exemplified in FIG. 7 exist. The allocation unit 34 allocates the acquisition object pairs in order from the stage 0 of the object check table. If a first acquisition object pair (object A, object B) is acquired, then the allocation unit 34 sets the flags of the identifier A and the identifier B corresponding to the stage 0 to 1. Then, if another acquisition object pair (object A, object C) is acquired, then since the flag of the identifier A is 1 although the flag of the identifier C corresponding to the stage 0 remains 0, the acquisition object pair (object A, object C) cannot be calculated by the thread 0. Therefore, since the flags of the identifier A and the identifier C corresponding to the next stage (stage 1) are 0, the allocation unit 34 allocates the object pair (object A, object C) to the stage 1. In particular, the flags of the identifier A and the identifier C corresponding to the stage 1 are set to 1. Then, since the allocation unit 34 can allocate a next acquisition object pair (object D, object E) to the stage 0, the flags of the identifier D and the identifier E corresponding to the stage 0 are set to 1. The flags are set for the acquisition object pairs in this manner. From the object check table, the timing at which a process for each acquisition object pair is to be executed can be found.

The calculation unit 35 calculates an influence of contact of two objects, which are in contact with each other, upon the positions of the objects. The calculation unit 35 solves a restriction condition for two objects contacting with each other to calculate physical quantities to be provided to the objects in order to satisfy the restriction condition. In the present embodiment, the calculation unit 35 solves the restriction condition for the acquisition object pairs in the order of the stage numbers allocated in the object check table produced by the allocation unit 34 for the acquisition object pairs to calculate physical quantities to be provided to the objects. Here, although the calculation unit 35 executes the calculation process in order beginning with the stage 0, the order does not matter if the stages are not calculated in parallel to each other.

In a physical simulation or the like in which the position, which varies together with time, of a plurality of objects which move in a virtual space, for example, a pair of objects contacting with each other at the time counter t=0 are in most cases in contact with each other also at the time counter t=1. Therefore, from among a plurality of acquisition object pairs at the time counter t=n, an object pair (hereinafter referred to as common object pair) whose two components are common to those of some of the acquisition object pairs at the time counter t=n−1 is specified. Then, when the calculation unit 35 executes calculation at the time counter t=n, the processing amount of the calculation is reduced by using information of the common object pair. In the following, a process for specifying a common object pair is described particularly. The process for specifying a common object is implemented by the sorting unit 32 and the specification unit 33.

First, the specification unit 33 specifies one of two objects included in an acquisition object pair as a reference object and specifies the other as an attending object based on a given criterion. For example, the specification unit 33 specifies, based on the magnitude of identifiers of two objects included in an acquisition object pair, an object of a smaller identifier as a reference object. In particular, since the magnitude relationship of the identifiers of the object pair (object A, object B) is A<B, the object A is specified as a reference object and the object B is specified as an attending object. Alternatively, the object of a greater identifier may be specified as a reference object.

Then, the specification unit 33 determines each of a plurality of acquisition object pairs at t=n as a determination target pair and extracts, from among a plurality of acquisition object pairs at t=n−1, an object pair whose reference object is common to that of the determination target pair as a comparison target pair. Then, the specification unit 33 determines whether or not the determination target pair and the comparison target pair include a common attending object, and specifies, if the attending objects are common, the determination target pair as a common object pair. It is to be noted that, where the attending objects are not common, the specification unit 33 specifies the determination target pair as a novel object pair (hereinafter referred to as new object pair) which does not exist at t=n−1 but appears at t=n. An example of a determination target pair and a comparison target pair is depicted in FIG. 8. If (A, B) from among the acquisition object pairs at t=n in FIG. 8 is determined as a determination target pair, then an object pair whose reference object is A from among the acquisition object pairs at t=n−1 becomes a comparison target pair. In particular, (A, B) and (A, D) become comparison target pairs. By connecting the determination target pair (A, B) and (A, B) and (A, D) which become a comparison target pair by lines, it is indicated that they correspond as a determination target pair and a comparison target pair. Also from among the other object pairs, a comparison target pair is associated with a determination target pair. Then, the specification unit 33 determines whether or not the determination target pair (A, B) and the comparison target pairs (A, B) and (A, D) include attending objects common to each other. Here, since both of the determination target pair (A, B) and the comparison target pair (A, B) include an attending object B, the determination target pair (A, B) is specified as a common object pair. Further, if the specification unit 33 determines whether or not the determination target pair (A, C) and the comparison target pairs (A, B) and (A, D) include a common attending object, then since the attending objects of the determination target pair and the comparison target pairs are different from each other, the determination target pair (A, C) is specified as a new object pair.

Since the specification unit 33 specifies a reference object and an attending object of an acquisition object pair and compares attending objects of a determination target pair and a comparison target pair which include a common reference object with each other, the number of comparison target pairs to be compared for the determination target pairs can be narrowed down. Further, the process carried out by the specification unit 33 for determining whether or not an attending object is common between a determination target pair and a comparison target pair can be executed by a similar algorithm of extracting comparison target pairs having a common referenced object and comparing the attending objects with each other whichever one of determination target pairs is selected. Therefore, the specification unit 33 can execute processes for determining whether or not an attending object is common between each of determination target pairs and each of comparison target pairs in parallel to each other.

Here, the sorting unit 32 may use a known bucket sorting process to sort a plurality of acquisition object pairs at t=n−1 in the order of the identifiers of reference objects. For example, if the sorting unit 32 sorts the acquisition object pairs at t=n−1 depicted in FIG. 8, then the order of the reference objects becomes A, A, B, D and F. Here, if the appearance number is calculated for each identifier, then it is 2 for A, 1 for B, 0 for C, 1 for D, 0 for E and 1 for F. Consequently, from among the sorted acquisition object pairs, the object pair the identifier of the reference object of which is A can be specified as the first and the second (from the number of A); the object pair the identifier of the reference object of which is B can be specified as the third (from the sum of the numbers of A and B and the number of B); and the object pair the identifier of the reference object of which is F can be specified as the fifth (from the sum of the numbers of A to F and the number of F). In this manner, an object pair having a specific identifier is specified depending upon the sum of numbers of identifiers up to the identifier and the number of the identifier. Therefore, by sorting acquisition object pairs at t=n−1 into an order of the identifiers of the reference objects, the specification unit 33 can extract a comparison target pair corresponding to the determination target pair readily. It is to be noted that the sorting unit 32 may otherwise use a known bucket sorting process to sort a plurality of acquisition object pairs at t=n into the order of the identifiers of the reference objects.

Alternatively, the specification unit 33 may extract, determining each of a plurality of acquisition object pairs at t=n−1 as a determination target pair, an object pair including a reference object common to that of the determination target pair as a comparison target pair. Then, the specification unit 33 determines whether or not an attending object is common to the determination target pair and the comparison target pair, and specifies, when the attending object is common, the object pair as a common object pair. It is to be noted that, when the attending objects are not common to each other, the specification unit 33 specifies the object pair as a deletion object pair which existed at t=n−1 but does not exist at t=n. In particular, the specification unit 33 determines whether or not the determination target pair (A, B) at t=n−1 and the comparison target pairs (A, B) and (A, C) at t=n include a common attending object. Here, since the attending objects of both of the determination target pair (A, B) and the comparison target pair (A, B) are B, the determination target pair (A, B) is specified as a common object pair. Further, if the specification unit 33 determines whether or not the determination target pair (A, D) and the comparison target pairs (A, B) and (A, C) include a common attending object, then since the attending objects of the determination target pair and the comparison target pairs are different from each other, the determination target pair (A, D) is specified as a deletion object pair.

Since the sorting unit 32 sorts determination target pairs and comparison target pairs into the order of the identifiers in this manner, the extraction process of comparison target pairs having reference objects common to those of the determination target pairs can be facilitated and the process by the specification unit 33 for specifying a common object pair can be speeded up.

Figure 9:
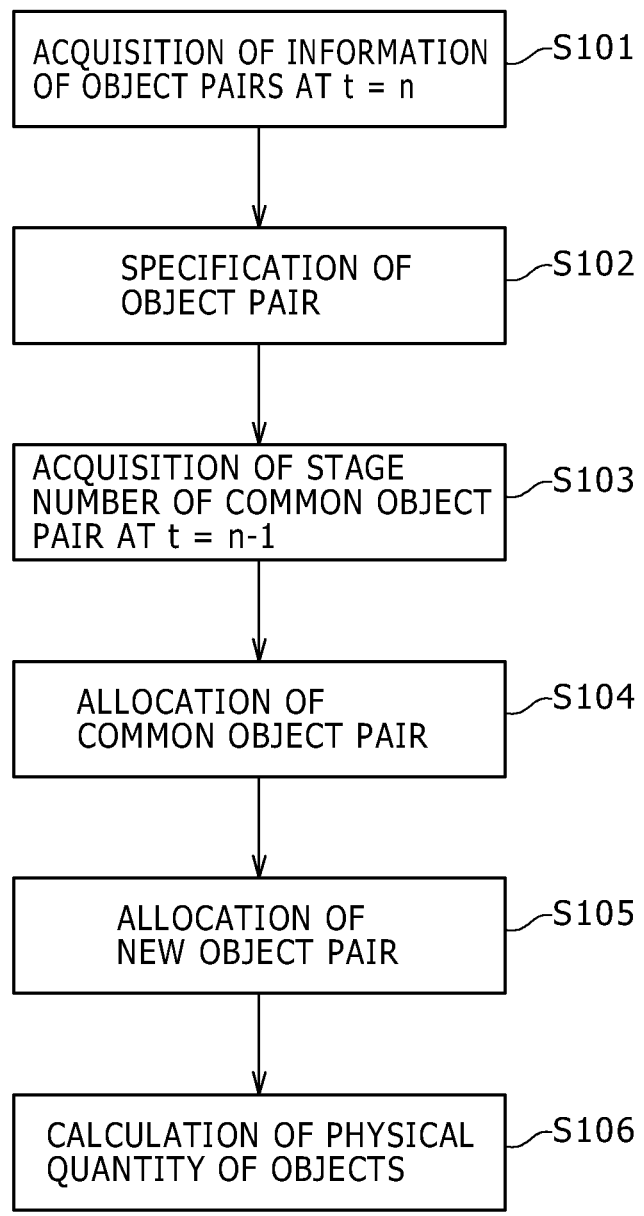
FIG. 9 is a flow chart illustrating an example of a flow of an object physical quantity calculation process which uses a common object pair in the present embodiment.

Here, an object physical quantity calculation process which uses a common object pair specified by the common object pair specification process is described with reference to a flow chart of FIG. 9.

The object pair information acquisition unit 31 acquires information of object pairs which are in contact with each other at the time counter t=n (S101).

The specification unit 33 compares the acquisition object pairs at t=n acquired by the process S101 by the object pair information acquisition unit 31 and the object pairs acquired by the object pair information acquisition unit 31 at the time counter t=n−1 with each other to specify common object pairs and new object pairs (S102).

The allocation unit 34 refers to the object check table at the time counter t=n−1 stored in the storage unit 12 to acquire a stage number to which the common object pair specified by the process S102 by the specification unit 33 is allocated (S103).

The allocation unit 34 allocates the common object pair to the object check table at the time counter t=n (S104). At this time, the allocation unit 34 allocates the common object pair to a stage number at the time counter t=n−1 acquired by the process S103. In particular, for the common object pair, flag setting same as that in the object check table at the time counter t=n−1 is carried out.

The allocation unit 34 allocates the new object pair to the object check table to which the common object pair has been allocated by the process S104 (S105). Then, the produced object check table is retained into the storage unit 12 in an associated relationship with the time counter t=n.

The calculation unit 35 synthesizes the common object pair and the new object pair specified by the process S102 to produce a processing object pair. Then, the calculation unit 35 solves the restriction condition for the object pair in the order of the stage number allocated in the object check table produced by the process S105 to calculate a physical quantity to be provided to each object (S106).

Since, in a physical simulation or the like, the position of an object rarely changes by a great amount in the given unit time period d, if the acquisition object pairs at t=n−1 and the acquisition object pairs at t=n are compared with each other, then the number of common object pairs is greater than the number of new object pairs. By simplifying the allocation of such common object pairs by which the processing amount increases, the allocation process of the allocation unit 34 can be speeded up.

Now, an object sleep management process by the process S5 is described. The object sleep management process is implemented by the object pair information acquisition unit 31, the value application unit 41, the pointer value overwriting unit 42, the route value overwriting unit 43, an object connection block 44 and the pointer value updating block 45 depicted in FIG. 3.

When sleep management is to be carried out, it is desired to manage a plurality of objects contacting with each other as one group and place a plurality of objects belonging to the same group into a sleeping state at the same time or cancel the sleeping state of the objects at the same time. This is because, if this is not carried out, then, for example, in such a case that, although the sleeping state of some object is cancelled, a different object which contacts with the object remains in a sleeping state or in a like case, the object demonstrates an unnatural behavior such as hopping or jittering, resulting in failure to maintain the continuity in behavior. In particular, by applying a same management ID to all objects included in a connection object configured by connection of a plurality of objects which contact with each other, the plural objects which contact with each other can be managed as one group.

First, a process by the object connection block 44 for producing a connection object is described. The process for producing a connection object is implemented principally by the object pair information acquisition unit 31, value application unit 41, pointer value overwriting unit 42 and route value overwriting unit 43.

The object connection block 44 connects acquisition object pairs acquired by the object pair information acquisition unit 31 described hereinabove. The object connection block 44 determines one of three or more objects contacting with each other as a terminal end object and provides, to each object, a pointer value indicative of a contact destination object of the object to connect the objects. Then, the three or more objects connected by the object connection block 44 become a connection object. The pointer value is the identifier of the contact destination object, and the pointer value of the terminal end object is the identifier of the terminal end object itself without fail. In other words, the pointer value of the terminal end object does not indicate any other object. Consequently, the connection object is connected in one direction such that the objects thereof are directed to the terminal object.

Here, a process for producing a connection object is described with reference to FIG. 10 which illustrates an example of a connection procedure of objects. It is assumed that, for example, three objects including an object A, an object B and an object C exist in a virtual space. The objects are acquired as acquisition object pairs (A, C) and (B, C) at the time counter t=n by the object pair information acquisition unit 31. It is intended to connect such three objects which contact with each other at the time counter t=n.

As an assumption for producing a connection object, it is assumed here that the objects are connected such that the object having a small identifier is given as a terminal object. To this end, the value application unit 41 applies a route value and a pointer value to each object. The route value is a value for determining a direction of the pointer value such that an object having a small identifier becomes a terminal end object. The pointer value is set so as to basically indicate an object of a low route value from an object of a high route value. It is to be noted that an object having a great identifier may otherwise be determined as a terminal end object. In this case, the pointer value is set so as to basically indicate an object of a high route value from an object of a low route value.

As illustrated in FIG. 10, an initial state (step 0) is a state in which no objects are connected to each other, and it is assumed here that the value application unit 41 provides initial values of the route value and the pointer value to each object. The initial values of the route value and the pointer value provided to each object are the identifier of the object.

At step 1, if the acquisition object pair (B, C) is acquired, then the route value overwriting unit 43 updates the route value applied to an object having a high route value (such an object is hereinafter referred to as high-route object) from between the objects included in the acquisition object pair to the route value provided to the object having a low route value (such object is hereinafter referred to as low-route object). Then, the pointer value overwriting unit 42 updates the pointer value applied to the high-route object to the identifier of the low-route object. In particular, the route value and the pointer value applied to the object C are changed to B, and the pointer from the object C to the object B is indicated.

At step 2, if the acquisition object pair (A, C) is acquired, then the route value overwriting unit 43 updates the route value applied to a high-route object (object C) to the route value applied to a low-route object (object A). Then, the pointer value overwriting unit 42 updates the pointer value applied to the high-route object to the identifier of the low-route object similarly as at step 1. In particular, the route value and the pointer value applied to the object C are changed to A.

At step 3, if the time counter t becomes t=n+1, then the pointer values applied to the objects are initialized. When the time counter t becomes t=n+1, since the object pair information acquisition unit 31 acquires an acquisition object pair at the time counter t=n+1, the pointer values of the objects at the time counter t=n are initialized. However, the route values applied to the object remain the values at the point of time at which the process at the time counter t=n is completed.

At step 4, if the acquisition object pair (B, C) is acquired, then the route value overwriting unit 43 updates the route value applied to a high-route object (object B) to the route value applied to a low-route object (object C). Then, the pointer value overwriting unit 42 updates the pointer value applied to the high-route object to the identifier of the low-route object. In particular, the route value of the object B becomes A and the pointer value of the object B becomes C, and a pointer from the object B to the object C is indicated.

At step 5, if the acquisition object pair (A, C) is acquired, then the route values of the object A and the object C are compared with each other. Here, the route value applied to the object A and the route value applied to the object C are equal to each other. In such a case as just described, through comparison of the identifiers of the objects, the pointer value overwriting unit 42 updates the pointer value applied to an object of a great identifier (object C) to the identifier of an object of a small identifier (object A). In other words, the pointer value applied to the object C becomes A, and a pointer from the object C to the object A is indicated. Then, at a point of time at which the step 5 ends, the object C and the object B are connected to the object A as a terminal end.

In this manner, route values at a point of time at which processing by the object connection block 44 at the time counter t=n is completed are set to route values at a point of time of starting of processing at the time counter t=n+1. Consequently, even when a connection object cannot be produced by one-time processing, as the time counter is incremented, each object is successively connected to the terminal object which is an object of a small identifier.

It is to be noted that, in the example described above, the acquisition object pairs (B, C) and (A, C) are individually processed once at the time counter t=n. The processes at the steps may be executed in parallel to each other. Further, the object connection block 44 may repetitively execute the processes for the object pairs (B, C) and (A, C) described above at the time counter t=n. In this case, if the acquisition object pair (B, C) is acquired after the step 2, the route value of the object B becomes A and the pointer value of the object B becomes C, and a state same as the state at the point of time at which the step 5 is completed is established. In any case, since the route value overwriting unit 43 retains the route values updated every time the route values are updated, a connection object whose terminal end is given by an object of the smallest identifier can be produced finally.

FIG. 11A is a view schematically depicting an example of a connection object produced by the object connection block 44. As depicted in FIG. 11A, the connection object is configured from objects A to E, and the object A is the terminal end object. An arrow mark designates a contact destination object indicated by the pointer value applied to each object. In particular, the pointer value of the object A in FIG. 11A is A; the pointer value of the object B is A; the pointer value of the object C is B; the pointer value of the object D is C; and the pointer value of the object E is D.

Here, a same management ID is applied to all objects which configure such a connection object as depicted in FIG. 11A to manage the objects as a group. Thus, in order for a same management ID to be applied to all objects, the terminal end object is determined as a representative of the connection object and is indicated by all of the other objects of the connection object. In other words, all of the pointer values of the objects configuring the connection object are set to the identifier of the terminal end object. By such setting, the identifier of the terminal end object is applied to all objects, and the objects can be managed as a group using the identifier of the terminal end object as a management ID of the group.

To this end, the pointer value updating block 45 updates the pointer value applied to each object to the pointer value of a contact determination object indicated by the pointer value of the object. In particular, if the pointer value updating block 45 updates the pointer values of the objects of the connection object depicted in FIG. 11A once, then since the pointer value of the object C is updated to the pointer value of the object B, it becomes A. Further, the pointer value of the object D becomes B which is the pointer value of the object C, and the pointer value of the object E becomes C which is the pointer value of the object D. FIG. 11B depicts a view wherein the pointer values of the objects of the connection object depicted in FIG. 11A are updated. As depicted in FIG. 11B, one-time updating does not cause the pointer values of all objects to indicate the terminal end object. Therefore, the pointer values of the objects of the connection object depicted in FIG. 11B are updated again. FIG. 11C depicts a view wherein the pointer values of the objects of the connection object depicted in FIG. 11B are updated. As depicted in FIG. 11C, the pointer value of the object D becomes A which is the pointer value of the object B, and the pointer value of the object E becomes A which is the pointer value of the object C. FIG. 12 is a view illustrating a transition of the pointer values of the objects when the pointer value updating block 45 carries out updating of the pointer values of the objects of the connection object depicted in FIG. 11A. As depicted also in FIG. 12, by the second-time updating, the pointer values of all objects come to indicate the terminal end object (object A).

Although the example exemplified here involves five objects, even if the number of objects increases, it is possible to cause the pointer values of all objects to indicate a terminal end object by a similar process. Further, the updating process by the pointer value updating block 45 can update the pointer values of all objects by a number of times of processing equal to $\log_2 R$ if the number of objects is R and is higher in speed than that in a case in which the objects are traced one by one from each object to the terminal end object.

Further, in the updating process by the pointer value updating block 45, all objects are processed in accordance with similar processes to each other of updating a pointer value to a pointer value of an object indicated by the pointer value. Therefore, the processes for updating a pointer value can be executed in parallel to each other for objects which configure a connection object.

The present technology has been described based on the embodiment thereof. The embodiment described hereinabove is illustrative, and it can be recognized by a person skilled in the art that various modifications can be made for combinations of the components and the processing procedures of the embodiment and that also the modifications are included in the spirit and scope of the present technology.

The present technology contains subject matter related to that disclosed in Japanese Priority Patent Application JP 2013-261859 filed in the Japan Patent Office on Dec. 18, 2013, the entire content of which is hereby incorporated by reference.

What is claimed is:

1. A simulation apparatus which simulates a position of each of a plurality of objects, which move in a virtual space together with time, at each of a plurality of points of time of calculation, comprising:
    an object pair information acquisition unit configured to acquire a plurality of pieces of information of object pairs each including, as components thereof, two objects which contact with each other at each of the plural points of time of calculation;
    an allocation unit configured to allocate, at each of the plural points of time of calculation, each of the plural object pairs corresponding to the acquired information to one of a plurality of groups such that two or more object pairs which include a common object do not belong to the same group; and
    a calculation unit configured to calculate, at each of the plural points of time of calculation, an influence of contact of two objects included in each of the plural object pairs corresponding to the acquired information upon positions of the two objects;
    the calculation unit executing the calculations of the object pairs in parallel to each other while preventing the calculations for the object pairs which belong to groups different from each other from being executed in parallel to each other;
    the allocation unit referring, when the allocation of an object pair at the present point of time of calculation is carried out, to allocation information when the object pairs were allocated to a plurality of groups at the immediately preceding point of time of calculation to determine allocation of the object pairs such that object pairs between which the two components are common at the immediately preceding point of time of calculation and at the present point of time of calculation belong to a group same as the group to which the two components were allocated at the immediately preceding point of time of calculation.

2. The simulation apparatus according to claim 1, further comprising:
    a specification unit configured to specify, at each of the plural points of time of calculation, an object pair whose two components are common to those of one of the object pairs corresponding to the information acquired at the immediately preceding point of time of calculation from among the plural object pairs corresponding to the acquired information;
    the specification unit using a given criterion to specify one and the other of two objects included in each of the plural object pairs corresponding to the acquired information as a reference object and an attending object, respectively;
    the specification unit being operable to determine each of the plural object pairs corresponding to the acquired information as a determination target pair, extract an object pair whose reference object is common to that of the determination target pair from among the plural object pairs corresponding to the information acquired at the immediately preceding point of time of calculation as a comparison target pair and determine whether or not the determination target pair and the comparison target pair have a common attending object thereby to specify the object pairs between which the two components are common.

3. The simulation apparatus according to claim 2, wherein the specification unit executes the process for determining whether or not the attending object is common between each of the determination target pairs and the comparison target pair in parallel for the determination target pairs.

4. The simulation apparatus according to claim 2, further comprising:
    a sorting unit configured to sort the plural object pairs corresponding to the acquired information by an identifier of the reference objects to produce an object pair sequence;
    the specification unit extracting, from within each of those object pairs which are included in one of the plural object pairs corresponding to the information acquired at the immediately preceding point of time of calculation and the plural object pairs corresponding to the information acquired at the present point of time of calculation, the comparison target pair on the basis of an object pair sequence obtained by the sorting of the other of the pluralities of object pairs by the sorting unit.

5. The simulation apparatus according to claim 2, wherein the specification unit uses a magnitude relationship between the identifiers of the two objects included in each of the plural object pairs corresponding to the acquired information as the given criterion to specify the reference object and the attending object.

6. A controlling method for a simulation apparatus which simulates a position of each of a plurality of objects, which move in a virtual space together with time, at each of a plurality of points of time of calculation, comprising:
   acquiring a plurality of pieces of information of object pairs each including, as components thereof, two objects which contact with each other at each of the plural points of time of calculation;
   allocating, at each of the plural points of time of calculation, each of the plural object pairs corresponding to the acquired information to one of a plurality of groups such that two or more object pairs which include a common object do not belong to the same group; and
   calculating, at each of the plural points of time of calculation, an influence of contact of two objects included in each of the plural object pairs corresponding to the acquired information upon positions of the two objects;
   the calculation being executed in parallel for the object pairs while the calculations for the object pairs which belong to groups different from each other are prevented from being executed in parallel to each other;
   in the allocation, when the allocation of an object pair at the present point of time of calculation is carried out, allocation information when the object pairs were allocated to a plurality of groups at the immediately preceding point of time of calculation being referred to to determine allocation of the object pairs such that object pairs between which the two components are common at the immediately preceding point of time of calculation and at the present point of time of calculation belong to a group same as the group to which the two components were allocated at the immediately preceding point of time of calculation.

7. A computer operating under the control of a computer program for a simulation apparatus, which simulates a position of each of a plurality of objects, which move in a virtual space together with time, at each of a plurality of points of time of calculation, the computer program causing the computer to carry out actions, comprising:
   acquiring a plurality of pieces of information of object pairs each including, as components thereof, two objects which contact with each other at each of the plural points of time of calculation;
   allocating, at each of the plural points of time of calculation, each of the plural object pairs corresponding to the acquired information to one of a plurality of groups such that two or more object pairs which include a common object do not belong to the same group; and
   calculating, at each of the plural points of time of calculation, an influence of contact of two objects included in each of the plural object pairs corresponding to the acquired information upon positions of the two objects;
   the calculation executing the calculations of the object pairs in parallel to each other while preventing the calculations for the object pairs which belong to groups different from each other from being executed in parallel to each other;
   the allocation referring, when the allocation of an object pair at the present point of time of calculation is carried out, to allocation information when the object pairs were allocated to a plurality of groups at the immediately preceding point of time of calculation to determine allocation of the object pairs such that object pairs between which the two components are common at the immediately preceding point of time of calculation and at the present point of time of calculation belong to a group same as the group to which the two components were allocated at the immediately preceding point of time of calculation.

8. A non-transitory, computer-readable information storage medium in which a program for a simulation apparatus is stored, the program simulates a position of each of a plurality of objects, which move in a virtual space together with time, at each of a plurality of points of time of calculation, the program, when executed by a computer, causes the computer to carry out actions, comprising:
   acquiring a plurality of pieces of information of object pairs each including, as components thereof, two objects which contact with each other at each of the plural points of time of calculation;
   allocating, at each of the plural points of time of calculation, each of the plural object pairs corresponding to the acquired information to one of a plurality of groups such that two or more object pairs which include a common object do not belong to the same group; and
   calculating, at each of the plural points of time of calculation, an influence of contact of two objects included in each of the plural object pairs corresponding to the acquired information upon positions of the two objects;
   the calculation executing the calculations of the object pairs in parallel to each other while preventing the calculations for the object pairs which belong to groups different from each other from being executed in parallel to each other;
   the allocation referring, when the allocation of an object pair at the present point of time of calculation is carried out, to allocation information when the object pairs were allocated to a plurality of groups at the immediately preceding point of time of calculation to determine allocation of the object pairs such that object pairs between which the two components are common at the immediately preceding point of time of calculation and at the present point of time of calculation belong to a group same as the group to which the two components were allocated at the immediately preceding point of time of calculation.

* * * * *